(12) United States Patent
Cho et al.

(10) Patent No.: US 6,593,038 B2
(45) Date of Patent: Jul. 15, 2003

(54) METHOD AND APPARATUS FOR REDUCING COLOR CONFLICTS DURING TRIM GENERATION FOR PHASE SHIFTERS

(75) Inventors: Seonghun Cho, Santa Clara, CA (US); Shao-Po Wu, Portola Valley, CA (US)

(73) Assignee: Numerical Technologies, Inc., San Jose, CA (US)

( * ) Notice: Subject to any disclaimer, the term of this patent is extended or adjusted under 35 U.S.C. 154(b) by 212 days.

(21) Appl. No.: 09/876,307

(22) Filed: Jun. 6, 2001

(65) Prior Publication Data

US 2002/0164533 A1 Nov. 7, 2002

Related U.S. Application Data

(60) Provisional application No. 60/288,738, filed on May 4, 2001.

(51) Int. Cl.⁷ .................................................. G03F 9/00
(52) U.S. Cl. .......................................................... 430/5
(58) Field of Search ........................ 430/5, 22; 716/19, 716/20, 21

(56) References Cited

U.S. PATENT DOCUMENTS

| | | | | |
|---|---|---|---|---|
| 4,456,371 A | 6/1984 | Lin | ............................... | 355/71 |
| 5,302,477 A | 4/1994 | Dao et al. | ....................... | 430/5 |
| 5,308,741 A | 5/1994 | Kemp | ......................... | 430/312 |

(List continued on next page.)

FOREIGN PATENT DOCUMENTS

| | | |
|---|---|---|
| DE | 195 45 163 A1 | 6/1996 |
| EP | 0 464 492 A1 | 1/1992 |
| EP | 0 653 679 A2 | 5/1995 |
| EP | 0 698 821 | 2/1996 |
| GB | 2333613 A | 7/1999 |
| JP | 62067547 | 3/1987 |
| JP | 2-140743 | 5/1990 |
| JP | 7-111528 | 2/1991 |
| JP | 6-67403 | 3/1994 |
| JP | 8-51068 | 2/1996 |
| JP | 8-236317 | 9/1996 |
| JP | 2638561 | 4/1997 |
| JP | 2650962 | 5/1997 |
| JP | 10-133356 | 5/1998 |
| JP | 11-143085 | 5/1999 |

(List continued on next page.)

OTHER PUBLICATIONS

Cooke, M., "OPC/PSM Designs For Poly Gate Layers", European Semiconductor, vol. 22, No. 7, pp. 57–59, Jul. 2000.

Granik, Y., et al., "Sub–Resolution Process Windows And Yield Estimation Technique Based On Detailed Full–Chip CD Simulation", SPIE, vol. 4182, pp. 335–341 (2000).

Plat, M., et al., "The Impact of Optical Enhancement Techniques on the Mask Error Enhancement Funchtion (MEEF)", SPIE, vol. 4000, pp. 206–214, Mar. 1–3, 2000.

(List continued on next page.)

*Primary Examiner*—S. Rosasco
(74) *Attorney, Agent, or Firm*—Park, Vaughan & Fleming LLP

(57) ABSTRACT

One embodiment of the invention provides a system for generating trim to be used in conjunction with phase shifters during an optical lithography process for manufacturing an integrated circuit. The system operates by identifying a feature within the integrated circuit to be created by using a phase shifter to produce a region of destructive light interference on a photoresist layer. Next, the system generates the phase shifter for a first mask, while ensuring that design rules are satisfied in defining dimensions for the phase shifter. After the phase shifter is generated, the system generates trim within a second mask, that is used in conjunction with the first mask, by deriving the trim from the previously-defined dimensions of the phase shifter while ensuring that the design rules are satisfied. Note that the design rules can be satisfied by cutting and/or patching portions of the phase shifter and associated trim.

33 Claims, 9 Drawing Sheets

U.S. PATENT DOCUMENTS

| | | | |
|---|---|---|---|
| 5,316,878 A | 5/1994 | Saito et al. | 430/5 |
| 5,324,600 A | 6/1994 | Jinbo et al. | 430/5 |
| 5,328,807 A | 7/1994 | Tanaka et al. | 430/311 |
| 5,334,542 A | 8/1994 | Saito et al. | 437/40 |
| 5,352,550 A | 10/1994 | Okamoto | 430/5 |
| 5,364,716 A | 11/1994 | Nakagawa et al. | 430/5 |
| 5,424,154 A | 6/1995 | Borodovsky | 430/5 |
| 5,472,814 A | 12/1995 | Lin | 430/5 |
| 5,480,746 A | 1/1996 | Jinbo et al. | 430/5 |
| 5,496,666 A | 3/1996 | Chu et al. | 430/5 |
| 5,498,579 A | 3/1996 | Borodovsky et al. | 437/250 |
| 5,503,951 A | 4/1996 | Flanders et al. | 430/5 |
| 5,523,186 A | 6/1996 | Lin et al. | 430/5 |
| 5,527,645 A | 6/1996 | Pati et al. | 430/5 |
| 5,532,090 A | 7/1996 | Borodovsky | 430/5 |
| 5,537,648 A | 7/1996 | Liebmann et al. | 395/500 |
| 5,538,815 A | 7/1996 | Oi et al. | 430/5 |
| 5,539,568 A | 7/1996 | Lin et al. | 359/285 |
| 5,565,286 A | 10/1996 | Lin | 430/5 |
| 5,573,890 A | 11/1996 | Spence | 430/311 |
| 5,595,843 A | 1/1997 | Dao | 430/5 |
| 5,620,816 A | 4/1997 | Dao | 430/5 |
| 5,635,316 A | 6/1997 | Dao | 430/5 |
| 5,636,131 A | 6/1997 | Liebmann et al. | 364/490 |
| 5,702,848 A | 12/1997 | Spence | 430/5 |
| 5,725,969 A | 3/1998 | Lee | 430/5 |
| 5,761,075 A | 6/1998 | Oi et al. | 364/488 |
| 5,766,804 A | 6/1998 | Spence | 430/5 |
| 5,766,806 A | 6/1998 | Spence | 430/5 |
| 5,807,649 A | 9/1998 | Liebmann et al. | 430/5 |
| 5,827,623 A | 10/1998 | Ishida et al. | 430/5 |
| 5,858,580 A | 1/1999 | Wang et al. | 430/5 |
| 5,885,734 A | 3/1999 | Pierrat et al. | 430/5 |
| 5,923,562 A | 7/1999 | Liebmann et al. | 364/488 |
| 5,923,566 A | 7/1999 | Galan et al. | 364/489 |
| 5,994,002 A | 11/1999 | Matsuoka | 430/5 |
| 5,998,068 A | 12/1999 | Matsuoka | 430/5 |
| 6,004,702 A | 12/1999 | Lin | 430/5 |
| 6,010,807 A | 1/2000 | Lin | 430/5 |
| 6,057,063 A | 5/2000 | Liebmann et al. | 430/5 |
| 6,066,180 A | 5/2000 | Kim et al. | 716/19 |
| 6,077,630 A | 6/2000 | Pierrat | 430/5 |
| 6,083,275 A | 7/2000 | Heng et al. | 716/19 |
| 6,130,012 A | 10/2000 | May et al. | 430/5 |
| 6,139,994 A | 10/2000 | Broeke et al. | 430/5 |
| 6,185,727 B1 | 2/2001 | Liebmann | 716/19 |
| 6,228,539 B1 | 5/2001 | Wang et al. | 430/5 |
| 6,251,549 B1 | 6/2001 | Levenson | 430/11 |
| 6,258,493 B1 | 7/2001 | Wang et al. | 430/5 |
| 6,335,128 B1 | 1/2002 | Cobb et al. | 430/5 |
| 6,338,922 B1 | 1/2002 | Liebmann et al. | 430/5 |
| 6,420,074 B2 | 7/2002 | Wang et al. | 430/5 |
| 6,436,590 B2 | 8/2002 | Wang et al. | 430/5 |
| 2001/0000240 A1 | 4/2001 | Wang et al. | 430/5 |
| 2001/0028985 A1 | 10/2001 | Wang et al. | 430/5 |
| 2002/0083410 A1 | 6/2002 | Wu et al. | 716/19 |
| 2002/0127479 A1 | 9/2002 | Pierrat | 430/5 |
| 2002/0129327 A1 | 9/2002 | Pierrat et al. | 716/19 |
| 2002/0136964 A1 | 9/2002 | Pierrat | 430/5 |
| 2002/0142231 A1 | 10/2002 | Kling et al. | 430/5 |
| 2002/0142232 A1 | 10/2002 | Kling et al. | 430/5 |
| 2002/0144232 A1 | 10/2002 | Ma et al. | 716/21 |
| 2002/0152454 A1 | 10/2002 | Cote et al. | 716/21 |
| 2002/0155363 A1 | 10/2002 | Cote et al. | 430/5 |

FOREIGN PATENT DOCUMENTS

| | | |
|---|---|---|
| WO | WO 98/12605 A1 | 3/1998 |
| WO | WO 01/23961 A1 | 4/2001 |
| WO | WO 02/03140 A1 | 1/2002 |
| WO | WO 02/073312 A1 | 9/2002 |

OTHER PUBLICATIONS

Mansuripur, M., et al., "Projection Photolithography", Optic & Photonics News, 11, 17 pages, Feb. 2000.

Wang, R., et al., "Plarized Phase Shift Mask: Concept, Design, and Potential Advantages to Photolithography Process and Physical Design", Motorola Semiconductor Product Sector (12 pages).

Ogawa, K., et al., "Phase Defect Inspection by Differential Interference", Lasertee Corporation (12 pages).

Pistor, T., "Rigorous 3D Simulation of Phase Defects in Alternating Phase–Shifting Masks", Panoramic Technology Inc. (13 pages).

Semmier, A., et al., "Application of 3D EMF Simulation for Development and Optimization of Alternating Phase Shifting Masks", Infineon Technologies AG (12 pages).

Wong, A., et al., "Polarization Effects in Mask Transmission", University of California Berkeley (8 pages).

Hirai, Y., et al., "Automatic Pattern Generation System for Phase Shifting Mask", 1991 Symposium on VLSI Technology, Digest of Technical Papers, pp. 95–96, May 28–30, 1991.

Wong, A., et al., "Investigating Phase–Shifting Mask Layout Issues Using a Cad Toolkit", IEEE, pp. 27.4.1–27.4.4 (1991).

Teresawa, T., et al., "Imaging Characteristics of Multi-Phase–Shifting and Halftone Phase–Shifting Masks", Japanese Journal of Applied Physics, vol. 30, No. 11B, pp. 2991–2997, Nov. 1991.

Inoue, S., et al., "Simulation Study on Phase–Shifting Masks for Isolated Patterns", Japanese Journal of Applied Physics, vol. 30, No. 11B, pp. 3010–3015, Nov. 1991.

Watanabe, H., et al., "Detection and Printability of Shifter Defects in Phase–Shifting Masks", Japanese Journal of Applied Physics, vol. 30, No. 11B, pp. 3016–3020, Nov. 1991.

Watanabe, H., et al., "Pattern Transfer Characteristics of Transparent Phase Shifting Mask", Japanese Journal of Applied Physics, vol. 30, No. 11B, pp. 3004–3009, Nov. 1991.

Moniwa, A., et al., "Algorithm for Phase–Shift Mask Design with Priority on Shifter Placement", Jpn. J. Appl. Phys., vol. 32, Pt. 1, No. 12B, pp. 5874–5879, Dec. 1193.

Ooi, K., et al., "Computer Aided Design Software for Designing Phase–Shifting Masks", Jpn. J. Appl. Phys., vol. 32, Pt. 1, No. 12B, pp. 5887–5891, Dec. 1993.

Ohtsuka, H., et al., "Evaluation of Repair Phase and Size Tolerance for a Phase–Shift Mask", J. Vac. Sci. Technol. B, vol. 11, No. 6, pp. 2665–2668, Nov./Dec. 1993.

Moniwa, A., et al., "Heuristic Method for Phase–Conflict Minimization in Automatic Phase–Shift Mask Design", Jpn. J. Appl. Phys., vol. 34, Pt. 1, No. 12B, pp. 6584–6589, Dec. 1995.

Ohnuma, H., et al., "Lithography Computer Aided Design Technology for Embedded Memory in Logic", Jpn. J. Appl. Phys. vol. 37, Part I, No. 12B, pp. 6686–6688, Dec. 1998.

Kikuchi, K., et al., "Method of Expanding Process Window for the Double Exposure Technique with alt–PSMs", Optical Microlithography XIII, Proceeding of SPIE, vol. 4000, pp. 121–131 (2000).

Schmidt, R., et al., "Impact of Coma on CD Control for Multiphase PSM Designs", AMD, ASML (11 pages).

Erdmann, A., "Topography Effects and Wave Aberrations in Advanced PSM–Technology", Fraunhofer Institute of Integrated Circuits (11 pages).

Granik, Y., et al., "CD Variation Analysis Technique and its Application to the Study of PSM Mask Misalignment", Mentor Graphics (9 pages).

Hanyu, et al., "New Phase–Shifting Mask with Highly Transparent SiO2 Phase Shifters", Fujitsu Laboratories Ltd. (11 pages).

Ishiwata, N., et al., "Fabrication of Phase–Shifting Mask", Fujitsu Limited (11 pages).

Levenson, M., et al., "Phase Phirst! An Improved Strong–PSM Paradigm", M.D. Levenson Consulting, Petersen Advanced Lithography, KLA–Tencor (10 pages).

Levenson, M., et al., "SCAA Mask Exposures and Phase Phirst Design for 110nm and Below", M.D. Levenson Consulting, Canon USA, Inc., JSR Microelectronics, Inc. (10 pages).

Lin, B.J., "The Relative Importance of the Building Blocks for 193nm Optical Lithography", Linnovation, Inc. (12 pages).

McCallum, M., et al., "Alternating PSM Mask Performance—a Study of Multiple Fabrication Technique Results", International SEMATECH (6 pages).

Morikawa, Y., et al., "100nm–alt.PSM Structure Discussion for ArF Lithography", Dai–Nippon Printing Co., Ltd. (15 pages).

Ozaki, T., et al., "A 0.15um KrF Lithography for 1Gb DRAM Product Using Highly Printable Patterns and Thin Resist Process", Toshiba Corporation (2 pages).

Rhyins, P., et al., "Characterization of Quartz Etched PSM Masks for KrF Lithography at the 100nm Node", Photronics, Inc., MIT Lincoln Lab, ARCH Chemicals, Finle Technologies, KLATencor Corp. (10 pages).

Ronse, K., et al., "Thin Film Interference Effects in Phase Shifting Masks Causing Phase and Transmittance Errors", IMEC (15 pages).

Rosenbluth, A., et al., "Optimum Mask and Source Patterns to Print a Given Shape", IBM (17 pages).

Sakata, M., et al., "A Novel Radiaion Sensitive Spin–on–Glass Convertible into SiO2 and the Simple Fabrication Process Using It", Oki Electric Industry Co. Ltd. (3 pages).

Schmidt, R., et al., "Impact of Coma on CD Control for Multiphase PSM Designs", AMD, ASML (10 pages).

Sewell, H., et al., "An Evaluation of the Dual Exposure Technique", SVG Lithography Systems Inc. (11 pages).

Spence, C., et al., "Optimization of Phase–Shift Mask Designs Including Defocus Effects", AMD, Princeton University, Vecor Technologies Inc. (8 pages).

Suzuki, A., et al., "Multilevel Imaging System Realizing k1=–.3 Lithography", Canon Inc. (13 pages).

Vandenberghe, G., et al., "(Sub–)100nm Gate Patterning Using 248nm Alternating PSM", IMEC, Mentor Graphics (9 pages).

Fritze, M., et al., "100–nm Node Lithography with KrF?", MIT Lincoln Lab, Numberical Technologies, Photronics, Arch Chemicals (14 pages).

Fukuda, H., et al., "Patterning of Random Interconnect Using Double Exposure of Strong–Type PSMs", Hitachi Central Research Lab (8 pages).

Ferguson, R., et al., "Pattern–Dependent Correction of Mask Topography Effects for Alternating Phase–Shifting Masks", IBM Microelectronics, University of California Berkeley (12 pages).

Toublan, O., et al., "Phase and Transmission Errors Aware OPC Solution for PSM: Feasibility Demonstration", Mentor Graphics Corp. (7 pages).

Yanagishita, Y., et al., "Phase–Shifting Photolithography Applicable to Real IC Patterns", Fujitsu Limited (11 pages).

Levenson, M., et al., "The Phase–Shifting Mask II: Imaging Simulations and Submicrometer Resist Exposures", IEEE Transactions on Electron Devices, vol. ED–31, No. 6, pp. 753–763, Jun. 1984.

IBM, "Method to Produce Sizes in Openings in Photo Images Smaller Than Lithographic Minimum Size", IBM Technical Disclosure Bulletin, vol. 29, No. 3, p. 1328, Aug. 1986.

Buraschi, M., et al., "Optical–Diffraction–Based Modulation of Photoresist Profile or Microlithography Applications", Optical Engineering, vol. 28, No. 6, pp. 654–658, Jun. 1989.

Nitayama, A., et al., "New Phase Shifting Mask with Self–Aligned Phase Sifters for a Quarter Micron Photolithography", IEDM, pp. 3.3.1–3.3.4, Dec. 3–6, 1989.

Toh, K., et al., "Chromeless Phase–Shifted Masks: A New Approach to Phase–Shifting Masks", BACUS—Tenth Annual Symposium on Microlithography, Sep. 1990 (27 pages).

Yamanaka, T., et al., "A 5.9um2 Super Low Power SRAM Cell Using a New Phase–Shift Lithography", IEDM, pp. 18.3.1–18.3.4 (1990).

Nakagawa, K., et al., "Fabrication of 64m DRAM with I–Line Phase–Shift Lithography", IEDM, pp. 33.1.1–33.1.4 (1990).

Watanabe, H., et al., "Transparent Phase Shifting Mask", IEDM, pp. 33.2.1–33.2.4 (1990).

Burggraaf, P., "Four More Significant Japanese Advances in Phase Shifting Technology", Semiconductor International, p. 16, Dec. 1991.

Kemp, K., et al., "Optimized Phase Shift Mask Designs for Real Devices", KTI Microlithography Seminar, pp. 67–75, Oct. 14–15, 1991.

Newmark, D., et al., "Phase–Shifting Mask Design Tool", SPIE–11th Annual BACUS Symposium on Photmask Technology, vol. 1604, pp. 226–235, Sep. 25–27, 1991.

Nolscher, C., et al., "Investigation of Self–Aligned Phase–Shifting Reticles by Simulation Techniques", SPIE—Optical/Laser Microlithography IV, vol. 1463, pp. 135–150 (1991).

Burggraaf, P., "Lithography's Leading Edge, Part I: Phase–Shift Technology and Part 2: I–Line and Beyond", Semiconductor International, pp. 43–47 and 52–56, Feb. 1992.

Hosono, K., et al., "A Novel Architecture for High Speed Dual Image Generation of Pattern Data for Phase Shifting Reticle Inspection", SPIE—Integrated Circuit Metrology, Inspection, and Process Control VI, vol. 1673, pp. 229–235 (1992).

IBM, "Phase–Shift Mask Utilizing Silicon Oxy–Nitride as a Low Reflectivity Phase–Shift Layer", IBM Technical Disclosure Bulletin, vol. 34, No. 10B, pp. 360–361, Mar. 1992.

Ronse, K., et al., "Comparison of Various Phase Shift Strategies and Application to 0.35um ASIC Designs", SPIE—Optical/Laser Microlithography VI, vol. 1927, pp. 2–16 (1993).

Troccolo, P., et al., "Interferometric Measurement of Etch Depths in Phase Shift Masks", BACUS News, vol. 9, Issue 6, pp. 1 & 4–6, Jun. 1993.

Watanabe, H., et al., "Phase–Shifting Lithography: Maskmaking and its Application", J. Vac. Sci. Technol. B, vol. 11, No. 6, pp. 2669–2674, Nov./Dec. 1993.

Waas, T., et al., "Automatic Generation of Phase Shift Mask Layouts", Microelectronic Engineering, vol. 23, pp. 139–142 (1994).

Langston, J., et al., "Extending Optical Lithography to 0.25um and Below", Solid State Technology, pp. 57–64, Mar. 1995.

Nagahiro, Y., "Improved Mask Technique for Photolithography Applied to 0.25um LSI—Improvement of Resolution, Pattern Correction, Exposure Area", Nikkei Microdevices, pp. 1–6, Apr. 1995.

Okamoto, Y., et al., "A New Phase Shifting Mask Technology for Quarter Micron Photolithography", SPIE, vol. 2512, pp. 311–318 (1995).

Pierrat, C., et al., "Required Optical Characteristics of Materials for Phase–Shifting Masks", Applied Optics, vol. 34, No. 22, pp. 4923–4928, Aug. 1, 1995.

Galan, G., et al., "Altering Phase Shift Generation for Coplex Circuit Designs", SPIE, vol. 2884, pp. 508–519, Sep. 18–20, 1996.

Kanai, H., et al., "Sub–Quarter Micron Lithography with the Dual–Trench Type Alternating PSM", SPIE, vol. 2793, pp. 165–173 (1996).

Ishida, S., et al., "Large Assist Feature Phase–Shift Mask for Sub–Quarter Micrometer Window Pattern Formation", SPIE, vol. 3096, pp. 333–343 (1997).

Nakae, A., et al., "A Proposal for Pattern Layout Rule in Application of Alternating Phase Shift Mask", SPIE, vol. 3096, pp. 362–374 (1997).

Tsujimoto, E., et al., "Hierarchical Mask Data Design System (PROPHET) for Aerial Image Simulation, Automatic Phase–Shifter Placement, and Subpeak Overlap Checking", SPIE, vol. 3096, pp. 163–172 (1997).

Yamamoto, K., et al., "Hierarchical Processing of Levenson–Type Phase Shifter Generation", Jpn. J. Appl. Phys., vol. 36, Part 1, No. 12B, pp. 7499–7503, Dec. 1997.

Gordon, R., et al., "Design and Analysis of Manufacturable Alternating Phase–Shifting Masks", Bacus News, vol. 14, Issue 12, pp. 1–9, Dec. 1998.

Nara, M., et al., "Phase Controllability Improvement for Alternating Phase Shift Mask", Dai Nippon Printing Co., Ltd. (16 pages).

Peterson, J., et al., "Designing Dual–Trench Alternating Phase–Shift Masks for 140nm and Smaller Features Using 248–nm KrF and 193–nm ArF Lithography", Bacus News, vol. 14, Issue 8, pp. 1 & 4–13, Aug. 1998.

Kuo, C., et al., "Extension of Deep–Ultraviolet Lithography for Patterning Logic Gates Using Alternating Phase Shifting Masks", J. Vac. Sci. Technol. B, vol. 17, No. 6, pp. 3296–3300, Nov./Dec. 1999.

Palmer, S., et al., "Dual Mask Model–Based Proximity Correction for High Performance 0.10um CMOS Process", The 44th International Conference on Electron, Ion and Photon Beam Technology and Nanofabrication Abstracts, pp. 18–19, May 30–Jun.

Pierrat, C., "Investigation of Proximity Effects in Alternating Aperture Phase Shifting Masks", Numerical Technologies, Inc. (11 pages).

Cote, M., et al., "A Practical Application of Full–Feature Alternating Phase–Shifting Technology for a Phase–Aware Standard–Cell Design Flow", Numerical Technologies Inc. (6 pages).

Heng, F., et al., "Application of Automated Design Migration to Alternating Phase Sifht Mask Design", IBM Research Report RC 21978 (98769), Feb. 26, 2001 (7 pages).

Wong, A., et al., "Alternating Phase–Shifting Mask with Reduced Aberration Sensitivity: Lithography Considerations", Proc. SPIE, vol. 4346, pp. 1–9 (2001).

Pati, Y.C. et al., "Phase–Shifting Masks For Microlithography: Automated Design And Mask Requirements", J. Opt. Soc. Am., vol. 11, No. 9, pp. 2438–2452, Sep. 1994.

Pierrat, C. et al., "A Rule–Based Approach To E–Beam And Process–Induced Proximity Effect Correction For Phase–Shifting Mask Fabrication", SPIE, vol. 2194, pp. 298–309 (1994).

Pierrat, C. et al., "Phase–Shifting Mask Topography Effects On Lithographic Image Quality", IEEE, pp. 3.3.1–3.3.4 (1992).

Rieger, M. et al., "System For Lithography Proximity Compensation", Precim Company, Portland, Oregon, Sep. 1993 (28 pages).

Roman, B. et al., "Implications Of Device Processing On Photomask CD Requirements", SPIE, vol. 3236 (1997) (Abstract Only).

Spence, C. et al., "Automated Determination Of CAD Layout Failures Through Focus: Experiment And Simulation", SPIE, vol. 2197, pp. 302–313 (1994).

Spence, C. et al., "Detection Of 60° Phase Defects On Alternating PSMs", Advance Micro Devices, KLA–Tencor, DuPont RTC (2 pages).

Spence, C. et al., "Integration Of Optical Proximity Correction Strategies In Strong Phase Shifters Design For Poly–Gate Layers", Bacus News, vol. 15, Issue 12, pp. 1, 4–13, Dec. 1999.

Stirniman, J. et al., "Wafer Proximity Correction And Its Impact On Mask–Making", Bacus News, vol. 10, Issue 1, pp. 1, 3–7, 10–12, Jan. 1994.

Sugawara, M. et al., "Defect Printability Study Of Attenuated Phase–Shifting Masks For Specifying Inspection Sensitivity", Semiconductor Company, Sony Corporation, Kanagawa, Japan (16 pages).

Terasawa, T. et al., "0.3–Micron Optical Lithography Using A Phase–Shifting Mask", SPIE, Optical/Laser Microlithography II, vol. 1088, pp. 25–33, Mar. 1989.

Watanabe, H. et al., "Detection And Printability Of Shifter Defects In Phase–Shifting Masks II Defocus Characteristics", Jpn. J. Appl. Phys., vol. 31, pp. 4155–4160 (1992).

Wiley, J. et al., "Phase Shift Mask Pattern Accuracy Requirements And Inspection Technology", SPIE, Integrated Circuit Metrology, Inspection, and Process Control V, vol. 1464, pp. 346–355 (1991).

Jinbo, H. et al., "Improvement Of Phase–Shifter Edge Line Mask Method", Japanese Journal of Applied Physics, vol. 30, No. 11B, pp. 2998–3003, Nov. 1991.

Karklin, L., "A Comprehensive Simulation Study Of The Photomask Defects Printability", SPIE, vol. 2621, pp. 490–504 (1995).

Kimura, T. et al., "Subhalf–Micron Gate GaAs Mesfet Process Using Phase–Shifting–Mask Technology", IEEE, GaAs IC Symposium, pp. 281–284 (1991).

Levenson, M. et al., "Improving Resolution In Photolithography With A Phase–Shifting Mask", *IEEE* Transactions on Electron Devices, vol. ED–29, No. 12, pp. 1828–1836, Dec. 1982.

Lin, B.J., "Phase–Shifting Masks Gain An Edge", *IEEE* Circuits & Devices, pp. 28–35, Mar. 1993.

Liu, H.Y. et al., "Fabrication of 0.1 μm T–Shaped Gates By Phase–Shifting Optical Lithography", *SPIE*, Optical/Laser Microlithography VI, vol. 1927, pp. 42–52 (1993).

Matsuoka, K. et al., "Application Of Alternating Phase–Shifting Mask To 0.16 μm CMOS Logic Gate Patterns", Matsushita Electric Ind. Co., Ltd. (9 pages).

Mizuno, F. et al., "Practical Phase–Shifting Mask Technology For 0.3 μm Large Scale Integrations", *J. Vac. Sci. Technol.* β, vol. 12, No. 6, pp. 3799–3803, Nov./Dec. 1994.

Morimoto, H. et al., "Next Generation Mask Strategy—Technologies Are Ready For Mass Production Of 256MDRAM?", *SPIE*, vol. 3236, pp. 188–189 (1997).

Neureuther, A., "Modeling Phase Shifting Masks", *SPIE*, 10$^{th}$ Annual Symposium on Microlithography, vol. 1496, pp. 80–85 (1990).

Nistler, J. et al., "Large Area Optical Design Rule Checker For Logic PSM Application", *SPIE*, Photomask and X–Ray Mask Technology, vol. 2254, pp. 78–92 (1994).

Nistler, J. et al., "Phase Shift Mask Defect Printability Analysis", Proceedings of the Microlithography Seminar INTERFACE '93, OCG Microelectronic Materials, Inc., pp. 11–28 (1993).

Ohtsuka, H. et al., "Phase Defect Repair Method For Alternating Phase Shit Masks Conjugate Twin–Shifter Method", *Jpn. J. Appl. Phys.*, vol. 31, pp. 4143–4149 (1992).

Ackmann, P. et al., "Phase Shifting And Optical Proximity Corrections To Improve CD Control On Logic Devices In Manufacturing For Sub 0.35 μm I–Line", Advance Micro Devices (8 pages).

Asai, S. et al., "High Performance Optical Lithography Using A Separated Light Source", *J. Vac. Sci. Technol. B*, vol. 10, No. 6, pp. 3023–3026, Nov./Dec. 1992.

Barouch, E. et al., "OPTIMASK: An OPC Algorithm For Chrome And Phase–Shift Mask Design", *SPIE*, vol. 2440, pp. 192–206, Feb. 1995.

Brunner, T. et al., "170nm Gates Fabricated By Phase–Shift Mask And Top Anti–Reflector Process", *SPIE*, Optical/Laser Microlithography VI, vol. 1927, pp. 182–189 (1993).

Brunner, T., "Rim Phase–Shift Mask Combined With Off–Axis Illumination: A Path To 0.5λ/Numerical Aperture Geometries", *Optical Engineering*, vol. 32, No. 10, pp. 2237–2343, Oct. 1993.

Fukuda, H. et al., "Determination Of High–Order Lens Aberration Using Phase/Amplitude Linear Algebra", *J. Vac. Sci. Technol. B*, vol. 17, No. 6, pp. 3318–3321, Nov./Dec. 1999.

Fukuda, H., "Node–Connection/Quantum Phase–Shifting Mask: Path To Below 0.3 μm Pitch, Proximity Effect Free, Random Interconnects And Memory Patterning", *J. Vac. Sci. Technol. B*, vol. 17, No. 6, pp. 3291–3295, Nov./Dec. 1999.

Galan, G. et al., "Application Of Alternating–Type Phase Shift Mask To Polysilicon Level For Random Logic Circuits", *Jpn. J. Appl. Phys.*, vol. 33, pp. 6779–6784 (1994).

Inokuchi, K. et al., "Sub–Quarter Micron Gate Fabrication Process Using Phase–Shifting–Mask For Microwave GaAs Devices", Extended Abstracts of the 1991 Intl. Conference on Solid State Devices and Materials, Yokohama, Japan, pp. 92–94 (1991).

Inokuchi, K. et al., "Sub–Quarter–Micron Gate Fabrication Process Using Phase–Shifting Mask For Microwave GaAs Devices", *Japanese Journal of Applied Physics*, vol. 30, No. 12B, pp. 3818–3821, Dec. 1991.

Ishiwata, N. "Novel Alternating Phase Shift Mask With Improved Phase Accuracy", *SPIE*, Proceedings of the 17$^{th}$ Annual Symposium on Photomask Technology and Management, vol. 3236, pp. 243–249 (1997).

Jinbo, H. et al., "0.2 μm Or Less i–Line Lithography By Phase–Shifting–Mask Techology", *IEEE*, pp. 33.3.1–33.3.4 (1990).

Jinbo, H. et al., "Application Of Blind Method To Phase–Shifting Lithography", *IEEE*, 1992 Symposium on VLSI Technology Digest of Technical Papers, pp. 112–113 (1992).

METHOD AND APPARATUS FOR REDUCING COLOR CONFLICTS DURING TRIM GENERATION FOR PHASE SHIFTERS

RELATED APPLICATION

This application hereby claims priority under 35 U.S.C. §119 U.S. Provisional Patent Application No. 60/288,738 filed May 4, 2001.

The subject matter of this application is related to the subject matter in a co-pending non-provisional application by the same inventor as the instant application and filed on the same day as the instant application entitled, "Method and Apparatus for Using Phase Shifter Cutbacks To Resolve Phase Shifter Conflicts," having Ser. No. 09/876306, and filing date Jun. 6, 2001.

BACKGROUND

1. Field of the Invention

The invention relates to the process of fabricating semiconductor chips. More specifically, the invention relates to a method and an apparatus for reducing color conflicts during trim generation for masks to be used in an optical lithography process for manufacturing an integrated circuit.

2. Related Art

Recent advances in integrated circuit technology have largely been accomplished by decreasing the feature size of circuit elements on a semiconductor chip. As the feature size of these circuit elements continues to decrease, circuit designers are forced to deal with problems that arise as a consequence of the optical lithography process that is typically used to manufacture integrated circuits. This optical lithography process generally begins with the formation of a photoresist layer on the surface of a semiconductor wafer. A mask composed of opaque regions, which are generally formed of chrome, and light-transmissive clear regions, which are generally formed of quartz, is then positioned over this photo resist layer coated wafer. (Note that the term "mask" as used in this specification is meant to include the term "retical.") Light is then shone on the mask from a visible light source or an ultraviolet light source.

This light is generally reduced and focussed through an optical system that contains a number of lenses, filters and mirrors. The light passes through the clear regions of the mask and exposes the underlying photoresist layer. At the same time, the light is blocked by opaque regions of mask, leaving underlying portions of the photoresist layer unexposed.

The exposed photoresist layer is then developed, typically through chemical removal of the exposed/non-exposed regions of the photoresist layer. The end result is a semiconductor wafer with a photoresist layer having a desired pattern. This pattern can then be used for etching underlying regions of the wafer.

One problem in performing the optical lithography process arises from conflicts between phase shifters. Phase shifters are often incorporated into a mask in order to achieve line widths that are smaller than the wavelength of the light that is used to expose the photoresist layer through the mask. During phase shifting, destructive interference caused by two adjacent clear areas on a mask is used to create an unexposed area on the photoresist layer. This is accomplished by exploiting the fact that light passing through a mask's clear regions exhibits a wave characteristic having a phase that is a function of the distance the light travels through the mask material. By placing two clear areas adjacent to each other on the mask, one of thickness $t_1$ and the other of thickness $t_2$, one can obtain a desired unexposed area on the underlying photoresist layer caused by interference. By varying the thickness $t_1$ and $t_2$ appropriately, the light exiting the material of thickness $t_2$ is 180 degrees out of phase with the light exiting the material of thickness $t_1$. Phase shifting is described in more detail in U.S. Pat. No. 5,858,580, entitled "Phase Shifting Circuit Manufacture Method and Apparatus," by inventors Yao-Ting Wang and Yagyensh C. Pati, filed Sep. 17, 1997 and issued Jan. 12, 1999, which is hereby incorporated by reference.

As can be seen in FIG. 1A, when two phase shifters are located in close proximity to each other, conflicts can arise. In FIG. 1A, a first phase shifter comprising a zero-degree phase region 102 and a 180-degree phase region 104 is used to produce a small line width in a gate region 103 of polysilicon line 101. Similarly, a second phase shifter comprising a zero-degree phase region 114 and a 180-degree phase region 112 is used to produce a small line width in a gate region 113 of polysilicon line 111.

Unfortunately, when the first phase shifter and the second phase shifter are located in close proximity to each other, conflicts can arise between them as is illustrated in FIG. 1A. In existing systems, this can cause the system to halt with a phase conflict error.

What is needed is a method and an apparatus for resolving conflicts between phase shifters.

Another problem arises during the process of generating phase shifters and associated trim. A phase shifter located on a phase shifting mask will often be generated along with associated trim located on a second mask. During exposure of the second mask, this trim protects a region that is to be exposed by the phase shifter during exposure of the phase shifting mask. Unfortunately, design rules typically cause patches to be added to the shifter and to the associated trim and these patches can cause conflicts with other features on the masks. Note that in existing systems, phase shift regions cannot overlap with field polysilicon.

What is needed is a method and an apparatus for generating phase shifters and trim that satisfy design rules while minimizing conflicts with other mask features.

SUMMARY

One embodiment of the invention provides a system for generating trim to be used in conjunction with phase shifters during an optical lithography process for manufacturing an integrated circuit. The system operates by identifying a feature within the integrated circuit to be created by using a phase shifter to produce a region of destructive light interference on a photoresist layer. Next, the system generates the phase shifter for a first mask, while ensuring that design rules are satisfied in defining dimensions for the phase shifter. After the phase shifter is generated, the system generates trim within a second mask, that is used in conjunction with the first mask, by deriving the trim from the previously-defined dimensions of the phase shifter while ensuring that the design rules are satisfied. Note that the design rules can be satisfied by cutting and/or patching portions of the phase shifter and associated trim. In some instances patching may be necessary in combination with cutting in order to ensure that other requirements—e.g. minimum trim size—can be satisfied.

In one embodiment of the invention, the phase shifter in the first mask is used to expose a first polysilicon line in a gate region of the integrated circuit. Furthermore, the trim in the second mask is used to protect the first polysilicon line from exposure during use of the second mask.

In one embodiment of the invention, ensuring that the design rules are satisfied involves ensuring that there exists a minimum spacing between the trim and a second polysilicon line in the integrated circuit.

In one embodiment of the invention, ensuring that the design rules are satisfied involves ensuring that the trim is covered by the phase shifter in the first mask. It also involves ensuring that the phase shifter extends a minimum distance beyond the trim. In a variation on this embodiment, ensuring that the phase shifter extends the minimum distance beyond the trim involves ignoring the minimum distance in areas where the trim is connected to a wire.

In one embodiment of the invention, generating the phase shifter involves adding a patch to the phase shifter in order to satisfy a design rule.

In one embodiment of the invention, generating the phase shifter involves reducing the size of the phase shifter instead of adding a patch to the phase shifter in order to satisfy a design rule.

In one embodiment of the invention, ensuring that design rules are satisfied involves ensuring that inter-cell design rules are satisfied.

In one embodiment of the invention, ensuring that design rules are satisfied involves ensuring that intra-cell design rules are satisfied.

In one embodiment of the invention, the system additionally identifies a conflict area wherein a conflict is likely to occur between a first phase shifter and a second phase shifter on the first mask. When the conflict area is identified, the system resolves the conflict by cutting back one or both of the first phase shifter and the second phase shifter, so that the first phase shifter and the second phase shifter do not interfere with each other in the conflict area.

DETAILED DESCRIPTION

Using Cutbacks to Resolve Phase Shifter Conflicts

Figure 1B:
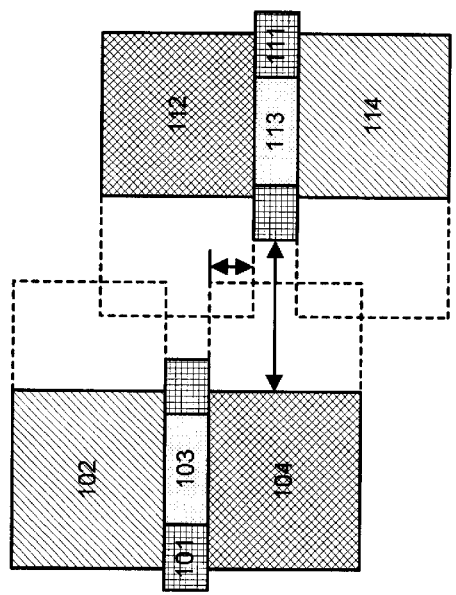
FIG. 1B illustrates the use of cutbacks to resolve phase shifter conflicts.
Figure 1C:
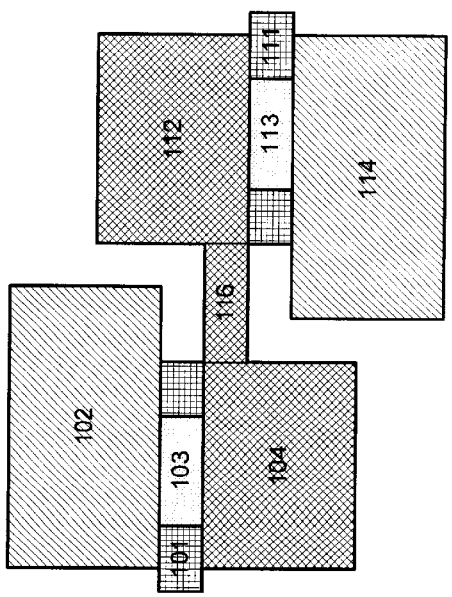
FIG. 1C illustrates the use of cutbacks along with phase shifter unification to resolve phase shifter conflicts in accordance with an embodiment of the invention.
Figure 1A:
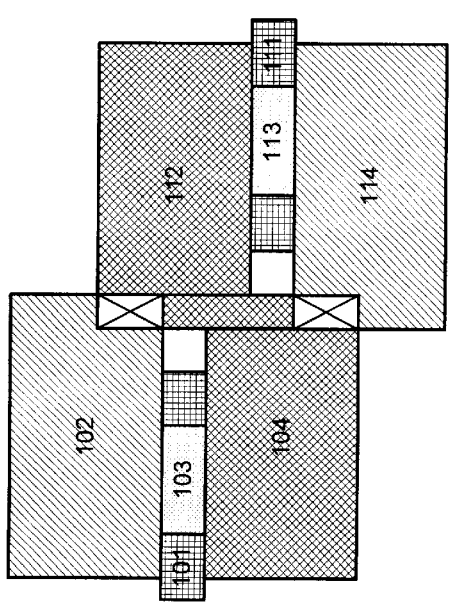
FIG. 1A illustrates two conflicting phase shifters.

FIG. 1A illustrates two conflicting phase shifters in accordance with an embodiment of the invention. As was mentioned above, a first phase shifter comprising a zero-degree phase region 102 and a 180-degree phase region 104 is used to produce a small line width in a gate region 103 of a polysilicon line 101. Similarly, a second phase shifter comprising a zero-degree phase region 114 and a 180-degree phase region 112 is used to produce a small line width in a gate region 113 of a polysilicon line 111. Unfortunately, the first phase shifter and the second phase shifter are located in close proximity to each other, creating a conflict between them.

FIG. 1B illustrates the use of cutbacks to resolve phase shifter conflicts in accordance with an embodiment of the invention. Note in the first phase shifter, the zero-degree phase region 102 and the 180-degree phase region 104 have been cutback to remove the shifter endcap extension that extends past the endcap of the associated transistor. Similarly, in the second phase shifter, the zero-degree phase region 114 and the 180-degree phase region 112 have been cut back to remove the shifter endcap extension. Also note that these cutbacks are performed automatically by a computer application as opposed to being performed manually by a human being through a design editor.

FIG. 1C illustrates the use of cutbacks along with phase shifter unification to resolve phase shifter conflicts in accordance with an embodiment of the invention. In FIG. 1C, 180-degree phase region 104 is unified with 180-degree phase region 112. This is possible because they can be unified with a shifter extension 116, which has a width that is larger than a specified minimum shifter width.

Figure 2:
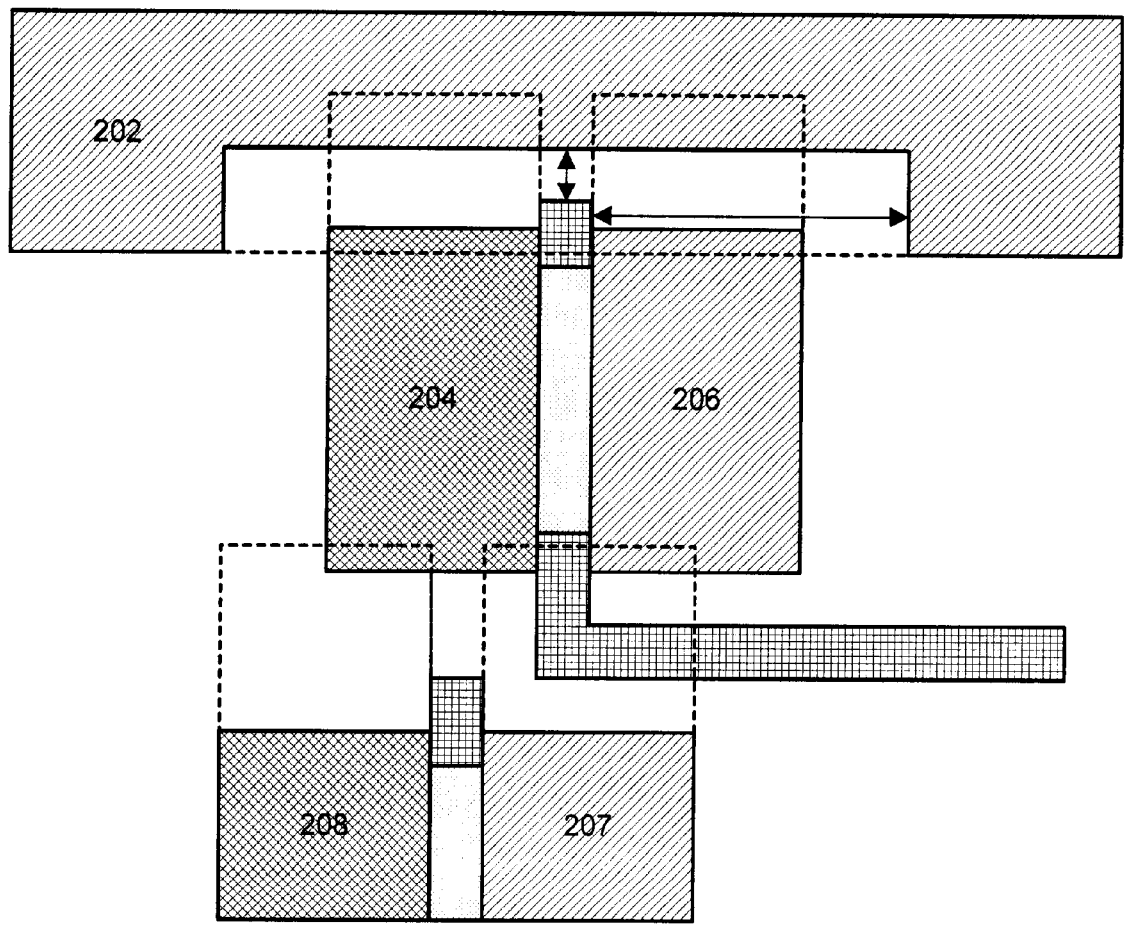
FIG. 2 illustrates another use of cutbacks to resolve a phase shifter conflict in accordance with an embodiment of the invention.

FIG. 2 illustrates another use of cutbacks to resolve a phase shifter conflict in accordance with an embodiment of the invention. In this example, a first shifter 202 conflicts with a second shifter comprised of 180-degree phase region 204 and zero-degree phase region 206. The second shifter also conflicts with a third phase shifter comprised of 180-degree phase region 208 and zero-degree phase region 207.

In this case, the conflicts can be resolved by cutting back the endcap extensions for the second transistor and the third transistor, while cutting away a portion of the first shifter 202 to accommodate the remaining endcap associated with the second phase shifter.

Process of Generating Phase Shifter Cutbacks

Figure 3:
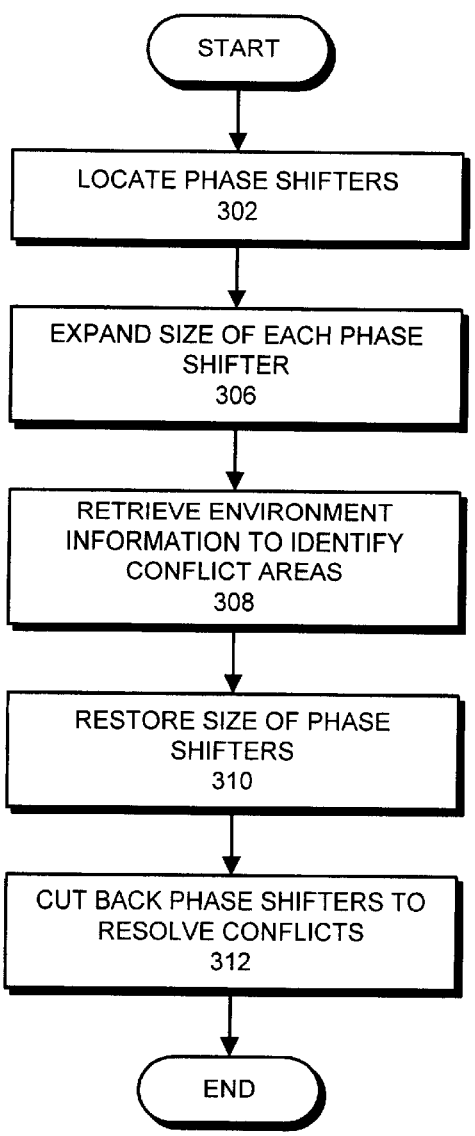
FIG. 3 is a flow chart illustrating the process of generating phase shifter cutbacks in accordance with an embodiment of the invention.

FIG. 3 is a flow chart illustrating the process of generating phase shifter cutbacks in accordance with an embodiment of the invention. The system first locates phase shifters within a mask that is used to create the integrated circuit (step 302). Next, the system expands the size of each phase shifter to a new expanded size defined by a halo around the original phase shifter (step 306). The system subsequently retrieves environment information for each of the expanded phase shifters. This environment information is used to identify potential conflicts between phase shifters (step 308). Next, the system restores the phase shifters back to their original size (step 310).

Finally, the system performs cutbacks on phase shifters to resolve conflicts as is illustrated in FIG. 1B, FIG. 1C and FIG. 2 (step 312). This can be done by cutback both or only one of the phase shifters while ensuring that both the phase shifters are of sufficient size to operate on the gate of the associated transistor.

Note that by using the halo the problem area that needs to be considered can be limited, which improves performance of the system. Moreover, the system may be able to solve the problem by performing manipulations within the halo.

Also note that the present invention is not meant to be limited to the use of halos. Other techniques can be used to identify potential conflicts between phase shifters. For example, scan line techniques can be used, or techniques that extend projections from shifter corners.

Moreover, note that a phase shifter can generally be of many different sizes. However, an exemplary phase shifter can be 400 nanometers in width and 600–700 nanometers in length. Such a phase shifter can be used for example to cut a 180 nanometer wide polysilicon line down to a width of 100 nanometers.

Wafer Fabrication Process

Figure 4A:
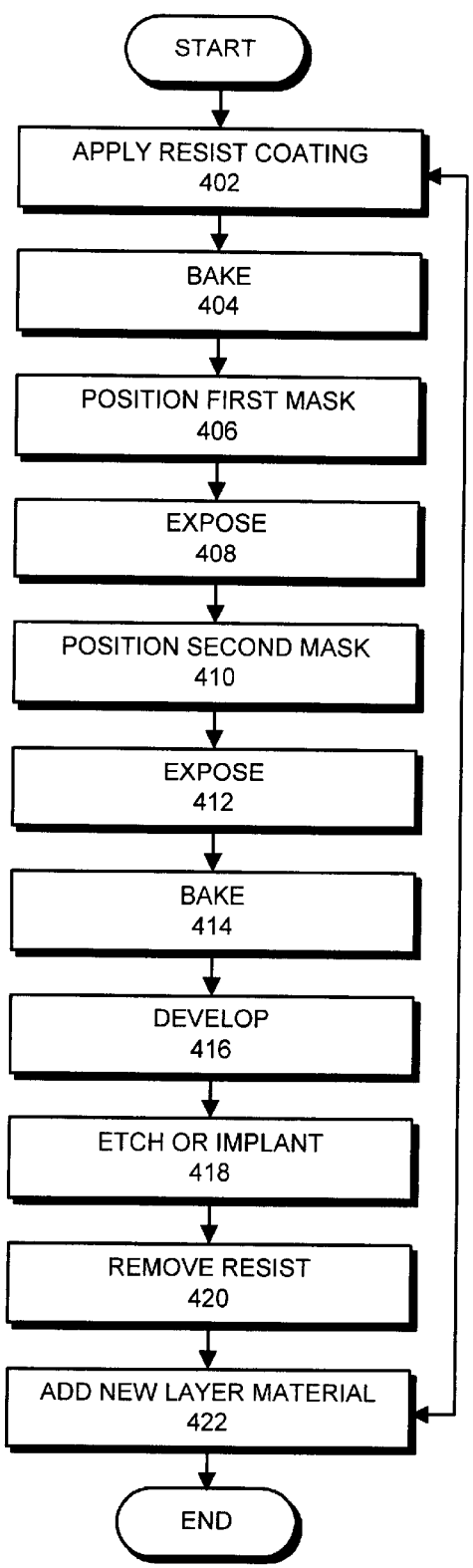
FIG. 4A is a flow chart illustrating the wafer fabrication process in accordance with an embodiment of the invention.

FIG. 4A is a flow chart illustrating the wafer fabrication process in accordance with an embodiment of the invention. The system starts by applying the resist coating to the top surface of a wafer (step 402). Next, the system bakes the resist layer (step 404). The system then positions the first mask over the photoresist layer (step 406), and then exposes the photoresist layer through the first mask (step 408). Next, the system positions the second mask over the photoresist layer (step 410), and then exposes the photoresist layer through the second mask (step 412). The system then bakes the wafer again (step 414) before developing the photoresist layer (step 416). Next, either a chemical etching or ion implantation step takes place (step 418) before the photoresist layer is removed (step 420). Finally, a new layer of material can be added and the process can be repeated for the new layer (step 422).

Generating Phase Shifters and Associated Trim

Figure 4B:
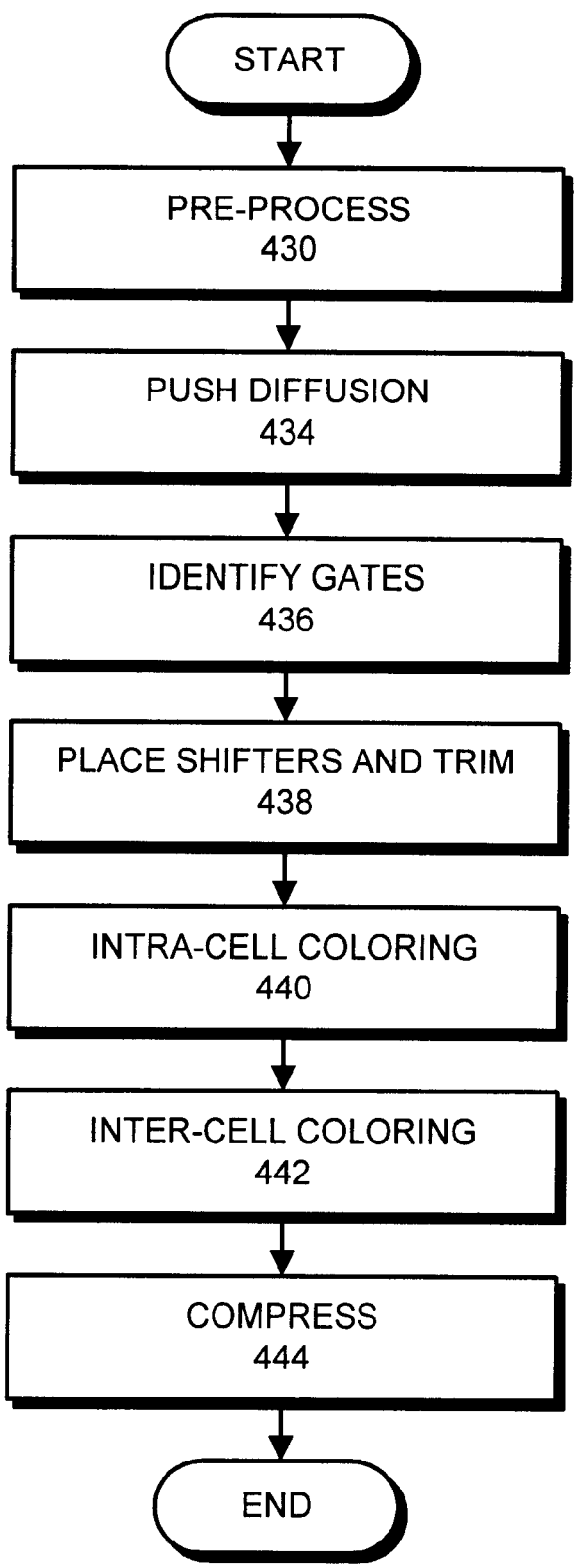
FIG. 4B is a flow chart illustrating the process of generating shifters and associated trim in accordance with an embodiment of the invention.

FIG. 4B is a flow chart illustrating the process of generating shifters and associated trim in accordance with an embodiment of the invention. Note that the system can operate on a hierarchical design that is specified in a standard hierarchical format, such as GDSII stream format. In this type of format, a design is specified in terms of cells, within themselves can be specified in terms of sub-cells.

During operation, the system starts with an optional pre-processing step in which any number of pre-processing operations can take place (step 430). This is followed by a push diffusion step, which pushes diffusion onto associated polysilicon lines, even if the diffusion and polysilicon lines are defined within different cells (step 434). Next, the system identifies any gates that are formed between polysilicon and diffusion regions (step 436). Note that there may also be an additional step at this point to handle larger composite gates that contain more than a few transistors, such as an exclusive-OR gate.

Next, the system places shifters and associated trim on masks to form narrow polysilicon gates (step 438). At this point, the system performs intra-cell coloring to detect conflicts between phase shifters and other mask features (step 440). The system also performs inter-cell coloring to detect conflicts between cells (step 442). Note that these coloring operations can include performing corrective actions, such as generating cutbacks, to resolve the coloring problems. The system may also use priority placement to produce better shapes, which can improve yield and manufacturability. Priority placement uses rule-based shape generation to handle special cases. Finally, the system can perform a compression operation in order to reuse cells if possible (step 444).

Figure 5B:
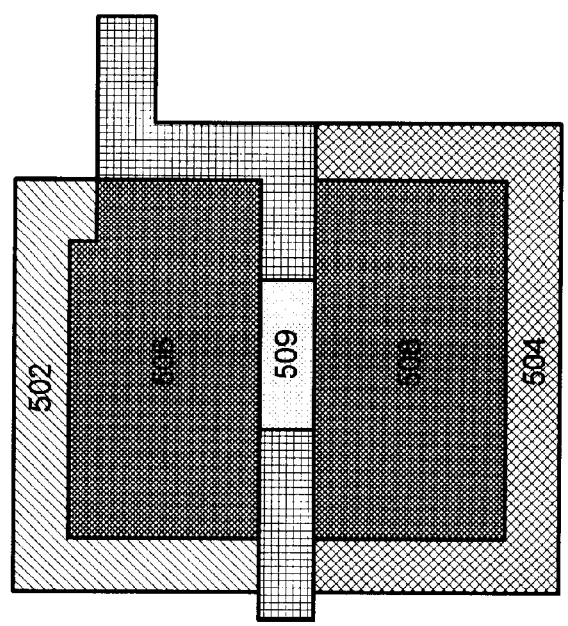
FIG. 5B illustrates generation of a reduced shifter and associated trim to satisfy design rules in accordance with an embodiment of the invention.
Figure 5A:
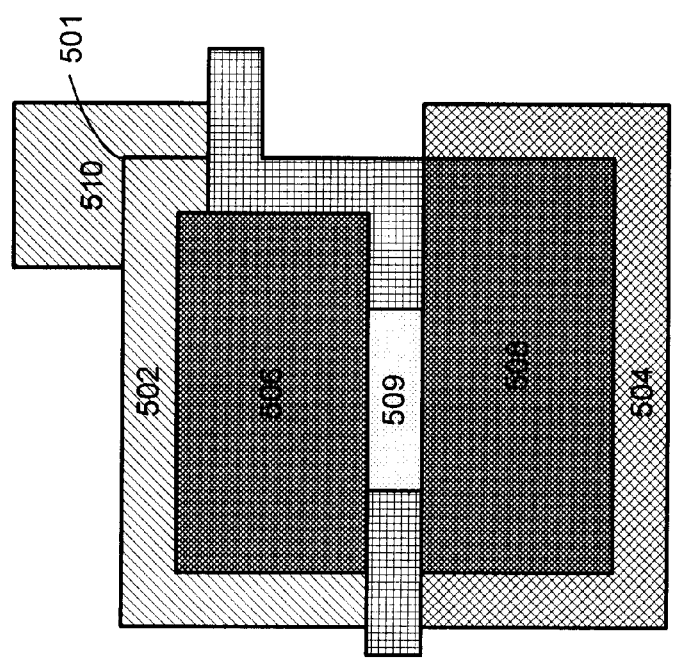
FIG. 5A illustrates patch generation to satisfy design rules.

FIG. 5A illustrates the use of patches to satisfy design rules. In this example, a shifter on a first mask contains a zero-degree phase region 502 and a 180-degree phase region 504, which create a region of destructive interference to form a gate 509. At the same time this phase shifter is being generated, the system also generates trim regions 506 and 508 on a second mask to protect the gate region that is to be exposed by the phase shifter in the first mask.

Unfortunately, zero-degree phase region 502 becomes narrower than a minimum width at location 501. This causes the system to add a shifter patch 510 to increase zero-degree phase region 502 up to the minimum width. However, adding patch 510 can create coloring problems in adjacent features.

FIG. 5B illustrates generation of a reduced shifter and associated trim to satisfy design rules in accordance with an embodiment of the invention. In this example, instead of adding a patch, the size of zero-degree phase region 502 is reduced, and the associated trim region 506, which is generated later, is also reduced. Note that this reduced shape satisfies design rules without creating coloring problems.

Figure 6C:
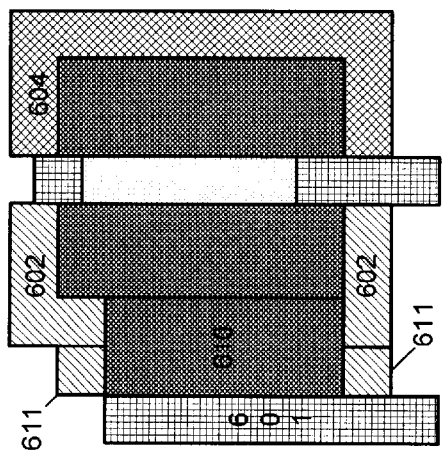
FIG. 6C illustrates the generation of a reduced shifter and associated trim to satisfy design rules.
Figure 6B:
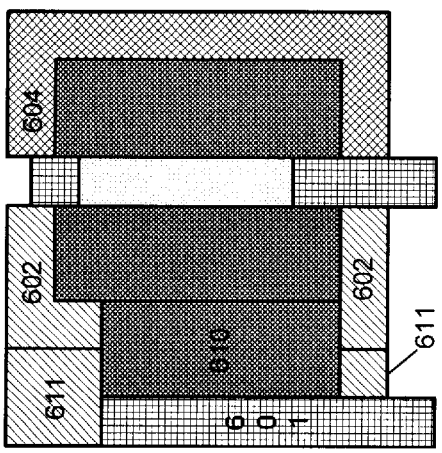
FIG. 6B illustrates the use of shifter and trim patches to satisfy design rules.
Figure 6A:
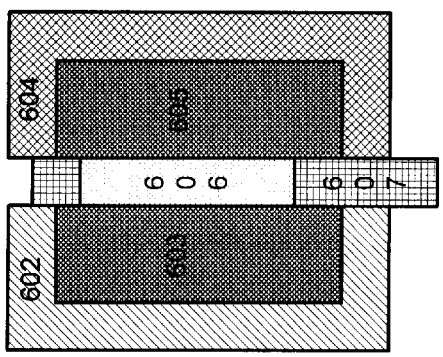
FIG. 6A illustrates a shifter in close proximity to a wire in accordance with an embodiment of the invention.
Figure 6A:
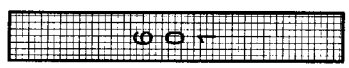

FIG. 6A illustrates a shifter in close proximity to a wire in accordance with an embodiment of the invention. Note that the separation between wire 601 and the phase shifter comprised of zero-degree phase region 602 and 180-degree phase region 604 violates a design rule. This can be remedied by adding shifter patch 611 and trim patch 610 as is illustrates in FIG. 6B. However, adding these patches leads to potential coloring conflicts.

Some of these coloring conflicts can be avoided by stopping shifter 611 at wire 601, and then subsequently generating trim patch 610 so that trim patch 610 is covered by shifter patch 611 (see FIG. 6C).

Figure 7A:
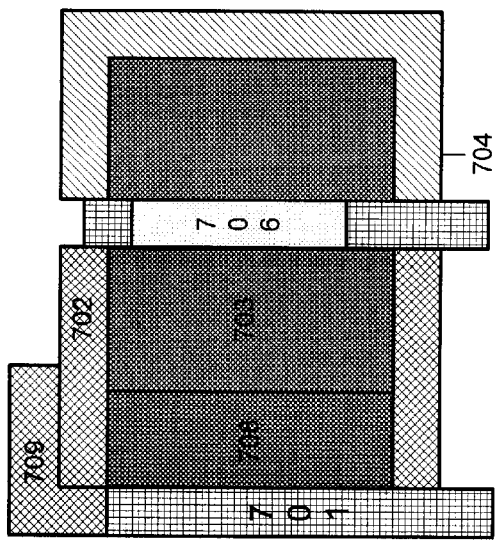
FIG. 7A illustrates a phase shifter in close proximity to a wire in accordance with an embodiment of the invention.
Figure 7B:
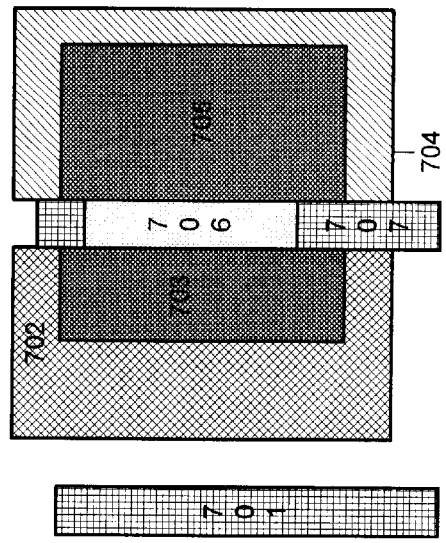
FIG. 7B illustrates the use of shifter and trim patches to satisfy design rules.

FIG. 7A illustrates a shifter comprised of 180-degree phase region 702 and zero-degree clear region 704 in close proximity to a wire 701 in accordance with an embodiment of the invention. In order to satisfy design rules regarding minimum spacing between trim 703 and wire 701, shifter patch 709 and trim patch 708 can be added to the shifter. However, these patches can lead to additional coloring conflicts with nearby features (see FIG. 7B).

Figure 7C:
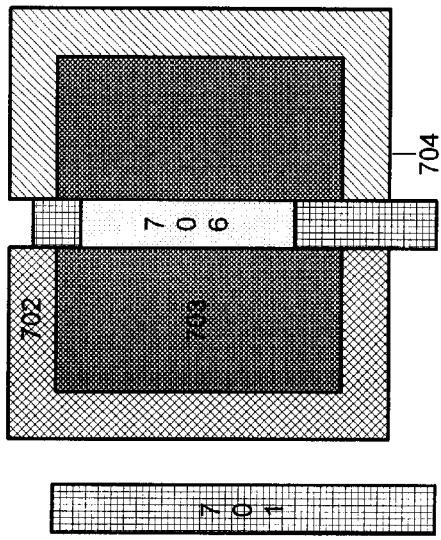
FIG. 7C illustrates the generation of a phase shifter in accordance with an embodiment of the invention.
Figure 7D:
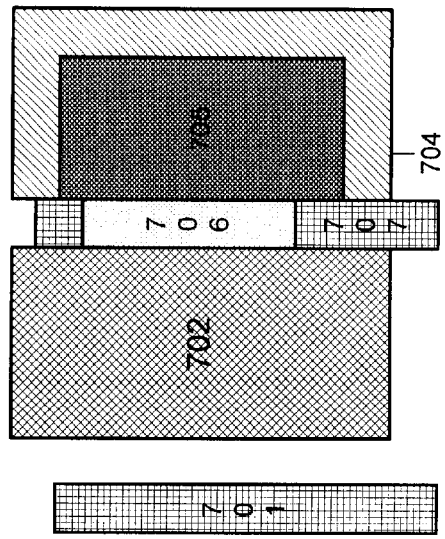
FIG. 7D illustrates the generation of trim in accordance with an embodiment of the invention.

These coloring problems can be avoided by first generating the shifter as is illustrated in FIG. 7C, and then generating trim that is covered by the shifter and that satisfies the design rule that specifies a minimum spacing between trim 703 and wire 701 (see FIG. 7D).

Figure 8:
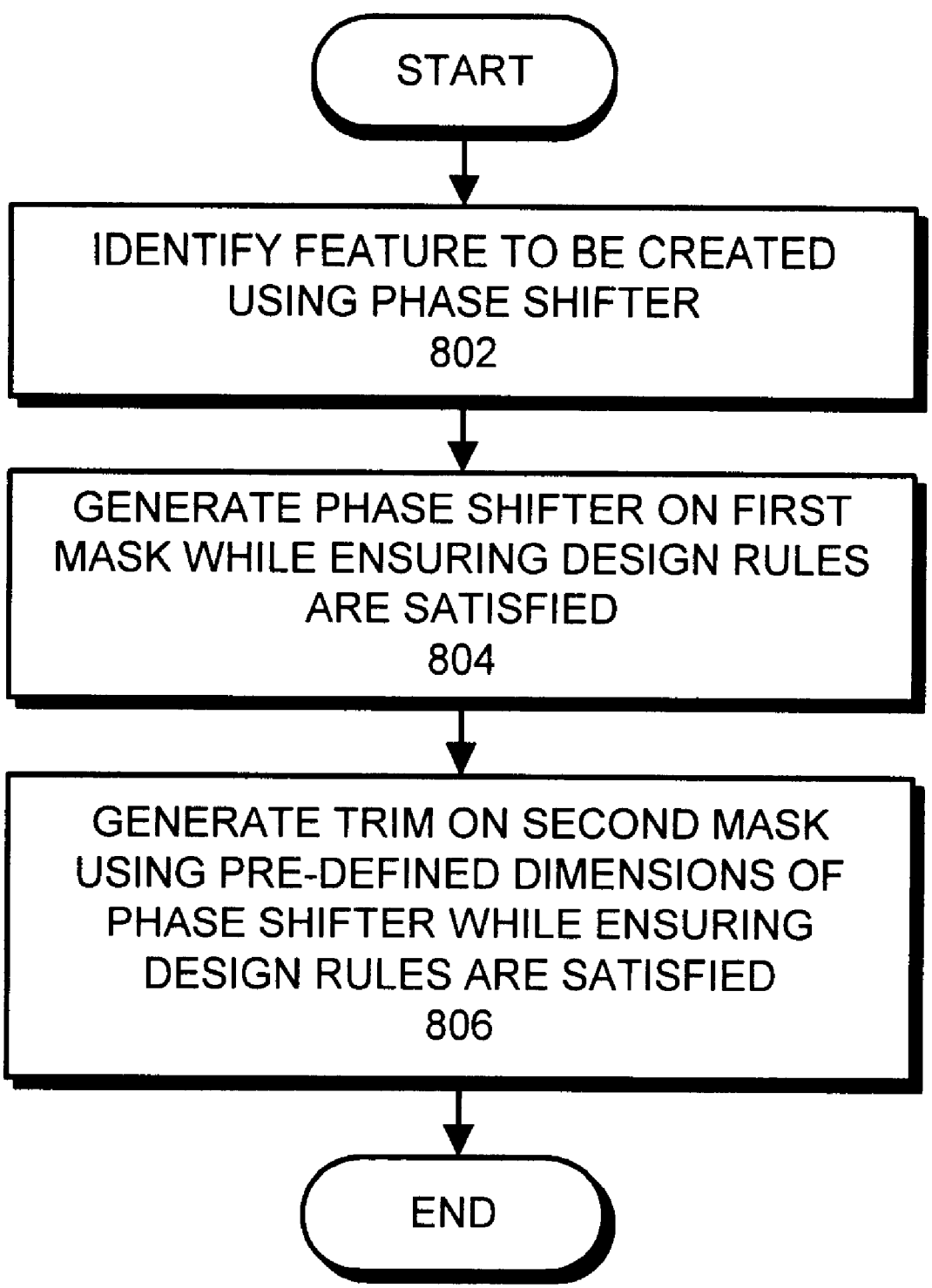
FIG. 8 is a flow chart illustrating the process of generating a phase shifter along with associated trim in accordance with an embodiment of the invention.

FIG. 8 is a flow chart illustrating the process of generating a shifter along with associated trim in accordance with an embodiment of the invention. The system starts by identifying features to be created using a phase shifter (step 802).

Next, the system generates a phase shifter on a first mask while ensuring that design rules are satisfied (step 804). Note that these design rules can be applied within a cell (intra-cell) in the design, or between cells (inter-cell).

After the dimensions of the phase shifter are defined, the system generates associated trim on a second mask using the pre-specified dimensions of the phase shifter and at the same time ensuring that design rules are satisfied (step 806).

Note that these design rules can include rules to ensure that there exists a minimum spacing between trim and another wire in the integrated circuit, as well as rules to ensure that trim is covered by a phase shifter and to ensure that the phase shifter extends a minimum distance past the trim except where the trim is connected to a wire.

Note that the design rules can be satisfied by cutting and/or patching portions of the phase shifter and associated trim. The system may also patch features in a way that violates design rules, and may then cut these features so that design rules are satisfied.

Non-Manhattan Geometries

Figure 9A:
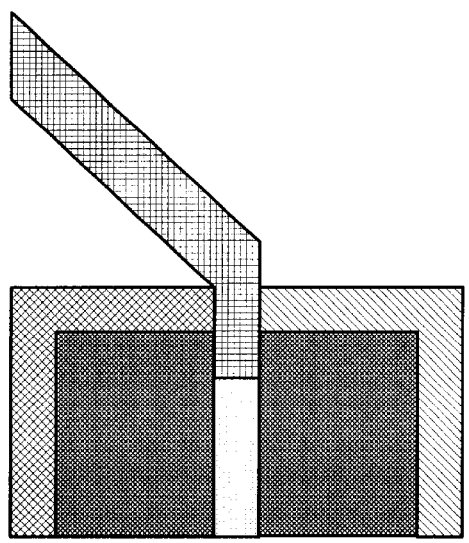
FIG. 9A illustrates a phase shifter with a non-Manhattan geometry in accordance with an embodiment of the invention.
Figure 9B:
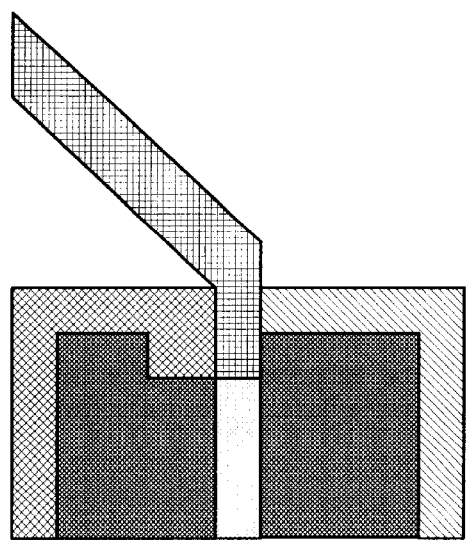
FIG. 9B illustrates the use of a trim cutback to satisfy design rules in accordance with an embodiment of the invention.
Figure 9C:
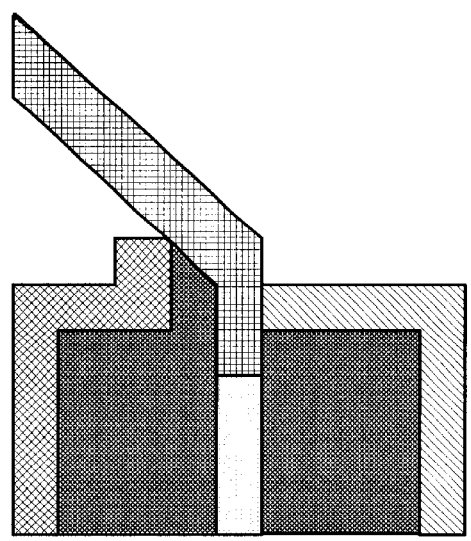
FIG. 9C illustrates the use of trim and shifter extensions to satisfy design rules in accordance with an embodiment of the invention.

Although the present invention is discussed with reference to Manhattan layouts, it is not meant to be limited in this way. For example, FIG. 9A illustrates a phase shifter in a non-Manhattan layout in accordance with an embodiment of the invention. Within this non-Manhattan layout, FIG. 9B illustrates the use of a trim cutback to satisfy design rules in accordance with an embodiment of the invention. Alternatively, FIG. 9C illustrates the use of trim and shifter extensions to satisfy design rules in accordance with an embodiment of the invention.

Note the above-described techniques can be adapted for a variety of lithographic processes, including deep and extreme ultraviolet and X-ray lithographic processes.

The preceding description is presented to enable any person skilled in the art to make and use the invention, and is provided in the context of a particular application and its requirements. Various modifications to the disclosed embodiments will be readily apparent to those skilled in the art, and the general principles defined herein may be applied to other embodiments and applications without departing from the spirit and scope of the invention. Thus, the invention is not intended to be limited to the embodiments shown, but is to be accorded the widest scope consistent with the principles and features disclosed herein.

The data structures and code described in this detailed description are typically stored on a computer-readable storage medium, which may be any device or medium that can store code and/or data for use by a computer system. This includes, but is not limited to, magnetic and optical storage devices such as disk drives, magnetic tape, CDs (compact discs) and DVDs (digital versatile discs or digital video discs), and computer instruction signals embodied in a transmission medium (with or without a carrier wave upon which the signals are modulated). For example, the transmission medium may include a communications network, such as the Internet.

The foregoing descriptions of embodiments of the invention have been presented for purposes of illustration and description only. They are not intended to be exhaustive or to limit the invention to the forms disclosed. Accordingly, many modifications and variations will be apparent to practitioners skilled in the art.

Additionally, the above disclosure is not intended to limit the invention. The scope of the invention is defined by the appended claims.

What is claimed is:

1. A method for generating trim to be used in conjunction with phase shifters during an optical lithography process for manufacturing an integrated circuit, comprising:

identifying a feature within the integrated circuit to be created by using a phase shifter to produce a region of destructive light interference on a photoresist layer;

generating the phase shifter within a first mask;

wherein generating the phase shifter involves ensuring that design rules are satisfied in defining dimensions for the phase shifter; and after the phase shifter is generated, generating trim within a second mask to be used in conjunction with the first mask;

wherein generating the trim involves deriving the trim from the previously-defined dimensions of the phase shifter while ensuring that the design rules are satisfied.

2. The method of claim 1, wherein the phase shifter in the first mask is used to expose a first polysilicon line in a gate region of the integrated circuit; and wherein the trim in the second mask is used to protect the first polysilicon line from exposure during use of the second mask.

3. The method of claim 2, wherein ensuring that the design rules are satisfied involves ensuring that there exists a minimum spacing between the trim and a second polysilicon line in the integrated circuit.

4. The method of claim 1, wherein ensuring that the design rules are satisfied involves:

ensuring that the trim is covered by the phase shifter in the first mask; and ensuring that the phase shifter extends a minimum distance beyond the trim.

5. The method of claim 4, wherein ensuring that the phase shifter extends the minimum distance beyond the trim involves ignoring the minimum distance in areas where the trim is connected to a wire.

6. The method of claim 1, wherein generating the phase shifter involves reducing the size of the phase shifter instead of adding a patch to the phase shifter in order to satisfy a design rule.

7. The method of claim 1, wherein ensuring that design rules are satisfied involves ensuring that inter-cell design rules are satisfied.

8. The method of claim 1, wherein ensuring that design rules are satisfied involves ensuring that intra-cell design rules are satisfied.

9. The method of claim 1, further comprising:

identifying a conflict area wherein a conflict is likely to occur between a first phase shifter and a second phase shifter on the first mask; and resolving the conflict by cutting back one or both of the first phase shifter and the second phase shifter, so that the first phase shifter and the second phase shifter do not interfere with each other in the conflict area.

10. The method of claim 1, wherein the design rules can:

ensure that there exists a minimum spacing between trim and another wire;

ensure that trim is covered by a phase shifter; and ensure that the phase shifter extends a minimum distance past the trim except where the trim is connected to a wire.

11. A computer-readable storage medium storing instructions that when executed by a computer cause the computer to perform a method for generating trim to be used in conjunction with phase shifters during an optical lithography process for manufacturing an integrated circuit, the method comprising:

identifying a feature within the integrated circuit to be created by using a phase shifter to produce a region of destructive light interference on a photoresist layer;

generating the phase shifter within a first mask;

wherein generating the phase shifter involves ensuring that design rules are satisfied in defining dimensions for the phase shifter; and after the phase shifter is generated, generating trim within a second mask to be used in conjunction with the first mask;

wherein generating the trim involves deriving the trim from the previously-defined dimensions of the phase shifter while ensuring that the design rules are satisfied.

12. The computer-readable storage medium of claim 11, wherein the phase shifter in the first mask is used to expose a first polysilicon line in a gate region of the integrated circuit; and wherein the trim in the second mask is used to protect the first polysilicon line from exposure during use of the second mask.

13. The computer-readable storage medium of claim 12, wherein ensuring that the design rules are satisfied involves ensuring that there exists a minimum spacing between the trim and a second polysilicon line in the integrated circuit.

14. The computer-readable storage medium of claim 11, wherein ensuring that the design rules are satisfied involves:

ensuring that the trim is covered by the phase shifter in the first mask; and ensuring that the phase shifter extends a minimum distance beyond the trim.

15. The computer-readable storage medium of claim 14, wherein ensuring that the phase shifter extends the minimum distance beyond the trim involves ignoring the minimum distance in areas where the trim is connected to a wire.

16. The computer-readable storage medium of claim 11, wherein generating the phase shifter involves reducing the size of the phase shifter instead of adding a patch to the phase shifter in order to satisfy a design rule.

17. The computer-readable storage medium of claim 11, wherein ensuring that design rules are satisfied involves ensuring that inter-cell design rules are satisfied.

18. The computer-readable storage medium of claim 11, wherein ensuring that design rules are satisfied involves ensuring that intra-cell design rules are satisfied.

19. The computer-readable storage medium of claim 11, wherein the method further comprises:

identifying a conflict area wherein a conflict is likely to occur between a first phase shifter and a second phase shifter on the first mask; and resolving the conflict by cutting back one or both of the first phase shifter and the second phase shifter, so that the first phase shifter and the second phase shifter do not interfere with each other in the conflict area.

20. The computer-readable storage medium of claim 11, wherein the design rules can:

ensure that there exists a minimum spacing between trim and another wire;

ensure that trim is covered by a phase shifter; and ensure that the phase shifter extends a minimum distance past the trim except where the trim is connected to a wire.

21. A set of masks for generating trim to be used in conjunction with phase shifters during an optical lithography process for manufacturing an integrated circuit, comprising:

a first mask;

a phase shifter within the first mask that produces a region of destructive light interference on a photoresist layer;

wherein dimensions of the phase shifter satisfy design rules;

a second mask; and trim within the second mask to be used in conjunction with the first mask;

wherein the trim is derived from the previously-defined dimensions of the phase shifter while ensuring that the design rules are satisfied.

22. The set of masks of claim 21, wherein the phase shifter in the first mask is used to expose a first polysilicon line in a gate region of the integrated circuit; and wherein the trim in the second mask is used to protect the first polysilicon line from exposure during use of the second mask.

23. The set of masks of claim 22, wherein the design rules ensure that there exists a minimum spacing between the trim and a second polysilicon line in the integrated circuit.

24. The set of masks of claim 21, wherein the design rules:

ensure that the trim is covered by the phase shifter in the first mask; and ensure that the phase shifter extends a minimum distance beyond the trim.

25. The set of masks of claim 24, wherein the design rules ignore the minimum distance in areas where the trim is connected to a wire.

26. The set of masks of claim 21, wherein the phase shifter is reduced from a default size instead of adding a patch to the phase shifter in order to satisfy a design rule.

27. The set of masks of claim 21, wherein the design rules are inter-cell design rules.

28. The set of masks of claim 21, wherein that design rules are intra-cell design rules.

29. The set of masks of claim 21, further comprising:

a second phase shifter and a third phase shifter, located on the first mask; and a cutback from a default size in at least one of the second phase shifter and the third phase shifter, so that the second phase shifter and the third phase shifter do not interfere with each other in a conflict area;

wherein if the second phase shifter and the third phase shifter were both of the default size, the second phase shifter and the third phase shifter would likely interfere with each other in the conflict area.

30. The set of masks of claim 21, wherein the design rules can:

ensure that there exists a minimum spacing between trim and another wire;

ensure that trim is covered by a phase shifter; and ensure that the phase shifter extends a minimum distance past the trim except where the trim is connected to a wire.

31. An integrated circuit produced using an optical lithography process, comprising:

a feature within the integrated circuit created by using a phase shifter located on a first mask to produce a region of destructive light interference on a photoresist layer;

wherein dimensions of the phase shifter satisfy design rules;

wherein the feature is additionally created by using trim within a second mask in conjunction with the phase shifter in the first mask;

wherein the trim is derived from previously-defined dimensions of the phase shifter while ensuring that design rules are satisfied.

32. A means for generating trim to be used in conjunction with phase shifters during an optical lithography process for manufacturing an integrated circuit, comprising:

an identification means for identifying a feature within the integrated circuit to be created by using a phase shifter to produce a region of destructive light interference on a photoresist layer;

a phase shifter generating means for generating the phase shifter within a first mask;

wherein generating the phase shifter involves ensuring that design rules are satisfied in defining dimensions for the phase shifter; and a trim generation means for generating trim within a second mask to be used in conjunction with the first mask;

wherein generating the trim involves deriving the trim from the previously-defined dimensions of the phase shifter while ensuring that design rules are satisfied.

33. A set of masks for generating trim to be used in conjunction with phase shifters during an optical lithography process for manufacturing an integrated circuit, comprising:

a first mask;

a phase shifter within the first mask that produces a region of destructive light interference on a photoresist layer;

wherein the phase shifter in the first mask is used to expose a first polysilicon line in a gate region of a first transistor in the integrated circuit;

wherein dimensions of the phase shifter satisfy design rules;

a second mask;

trim within the second mask to be used in conjunction with the first mask;

wherein the trim in the second mask is used to protect the first polysilicon line from exposure during use of the second mask;

wherein the trim is derived from the previously-defined dimensions of the phase shifter while ensuring that the design rules are satisfied; and a second polysilicon feature defined within the second mask and in close proximity to a portion of the trim located on one side of the first polysilicon line, such that if the portion of the trim were of a default size a design rule violation would occur between the portion of the trim and the second polysilicon feature;

wherein the portion of the trim is derived to be less that the default size so that the design rule violation.

* * * * *